(12) United States Patent
Reichel et al.

(10) Patent No.: US 8,674,416 B2
(45) Date of Patent: Mar. 18, 2014

(54) SEMICONDUCTOR DEVICE WITH REDUCED THRESHOLD VARIABILITY HAVING A THRESHOLD ADJUSTING SEMICONDUCTOR ALLOY IN THE DEVICE ACTIVE REGION

(71) Applicant: GLOBALFOUNDRIES Inc., Grand Cayman (KY)

(72) Inventors: Carsten Reichel, Dresden (DE); Thorsten Kammler, Ottendorf-Okrilla (DE); Annekathrin Zeun, Dresden (DE); Stephan Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/663,589

(22) Filed: Oct. 30, 2012

(65) Prior Publication Data

US 2013/0113019 A1 May 9, 2013

Related U.S. Application Data

(62) Division of application No. 12/775,863, filed on May 7, 2010, now Pat. No. 8,324,119.

(30) Foreign Application Priority Data

May 15, 2009 (DE) .......................... 10 2009 021 486

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)

(52) U.S. Cl.
USPC ............ 257/288; 257/310; 257/374; 257/279

(58) Field of Classification Search
USPC ......... 257/288, 279, 322, 336, 374, 376, 310, 257/311, 312, 314, 396, 347, 615, 616, 649, 257/E21.006, E21.009, E21.051, E21.058, 257/E21.127, E21.227, E21.206, E21.32, 257/E21.37
See application file for complete search history.

(56) References Cited

U.S. PATENT DOCUMENTS

| | | | |
|---|---|---|---|
| 8,324,119 B2* | 12/2012 | Reichel et al. | 438/791 |
| 2008/0079086 A1* | 4/2008 | Jung et al. | 257/369 |

(Continued)

FOREIGN PATENT DOCUMENTS

DE 102006051492 A1 5/2008 ............ H01L 27/092

OTHER PUBLICATIONS

Isheden et al., "pMOSFETs with recessed and selectively regrown $Si_{1-x}Ge_x$ source/drain junctions," *Materials Science in Semiconductor Processing*, 8:359-62, 2005.

(Continued)

*Primary Examiner* — David Nhu
(74) *Attorney, Agent, or Firm* — Amerson Law Firm, PLLC

(57) ABSTRACT

Generally, the subject matter disclosed herein is directed to semiconductor devices with reduced threshold variability having a threshold adjusting semiconductor material in the device active region. One illustrative semiconductor device disclosed herein includes an active region in a semiconductor layer of a semiconductor device substrate, the active region having a region length and a region width that are laterally delineated by an isolation structure. The semiconductor device further includes a threshold adjusting semiconductor alloy material layer that is positioned on the active region substantially without overlapping the isolation structure, the threshold adjusting semiconductor alloy material layer having a layer length that is less than the region length. Additionally, the disclosed semiconductor device includes a gate electrode structure that is positioned above the threshold adjusting semiconductor alloy material layer, the gate electrode structure including a high-k dielectric material and a metal-containing electrode material formed above the high-k dielectric material.

22 Claims, 5 Drawing Sheets

(56) References Cited

U.S. PATENT DOCUMENTS

| | | | |
|---|---|---|---|
| 2008/0237634 A1 | 10/2008 | Dyer et al. | 257/190 |
| 2009/0087974 A1 | 4/2009 | Waite et al. | 438/592 |
| 2010/0289090 A1 | 11/2010 | Kronholz et al. | 257/392 |
| 2011/0156172 A1 | 6/2011 | Kronholz et al. | 257/402 |

OTHER PUBLICATIONS

Translation of Official Communication from German Patent Office for German Patent Application No. 10 2009 021 489.5-33 dated Feb. 19, 2010.

* cited by examiner

SEMICONDUCTOR DEVICE WITH REDUCED THRESHOLD VARIABILITY HAVING A THRESHOLD ADJUSTING SEMICONDUCTOR ALLOY IN THE DEVICE ACTIVE REGION

CROSS-REFERENCE TO RELATED APPLICATION

This is a divisional of co-pending application Ser. No. 12/775,863, filed May 7, 2010.

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity.

2. Description of the Related Art

The fabrication of advanced integrated circuits, such as CPUs, storage devices, ASICs (application specific integrated circuits) and the like, requires a large number of circuit elements to be formed on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and reduction of gate resistivity, is a dominant design criterion for accomplishing an increase in the operating speed of the integrated circuits.

Presently, the vast majority of integrated circuits are fabricated on the basis of silicon due to the substantially unlimited availability thereof, the well-understood characteristics of silicon and related materials and processes and the experience gathered over the last 50 years. Therefore, silicon will likely remain the material of choice in the foreseeable future for circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current due to the required enhanced capacitive coupling of the gate electrode to the channel region that is accomplished by decreasing the thickness of the silicon dioxide layer. For example, a channel length of approximately 0.08 μm may require a gate dielectric made of silicon dioxide as thin as approximately 1.2 nm. Although, generally, usage of high speed transistor elements having an extremely short channel may be restricted to high-speed signal paths, whereas transistor elements with a longer channel may be used for less critical signal paths, the relatively high leakage current caused by direct tunneling of charge carriers through an ultra-thin silicon dioxide gate insulation layer may reach values for an oxide thickness in the range of 1-2 nm that may no longer be compatible with requirements for many types of integrated circuits.

Therefore, replacing silicon dioxide, or at least a part thereof, as the material for gate insulation layers has been considered. Possible alternative dielectrics include materials that exhibit a significantly higher permittivity so that a physically greater thickness of a correspondingly formed gate insulation layer nevertheless provides a capacitive coupling that would be obtained by an extremely thin silicon dioxide layer. It has thus been suggested to replace silicon dioxide with high permittivity materials, such as tantalum oxide ($Ta_2O_5$) with a k of approximately 25, strontium titanium oxide ($SrTiO_3$), having a k of approximately 150, hafnium oxide ($HfO_2$), HfSiO, zirconium oxide ($ZrO_2$) and the like.

When advancing to sophisticated gate architecture based on high-k dielectrics, additionally, transistor performance may also be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance even at a less critical thickness compared to a silicon dioxide layer, while additionally maintaining leakage currents at an acceptable level. On the other hand, metal-containing non-polysilicon material, such as titanium nitride and the like, may be formed so as to directly connect to the high-k dielectric material, thereby substantially avoiding the presence of a depletion zone. Therefore, the threshold voltage of the transistors is significantly affected by the work function of the gate material that is in contact with the gate dielectric material, and an appropriate adjustment of the effective work function with respect to the conductivity type of the transistor under consideration has to be guaranteed.

For example, appropriate metal-containing gate electrode materials, such as titanium nitride and the like, may frequently be used in combination with appropriate metal species, such as lanthanum, aluminum and the like, so as to adjust the work function to be appropriate for each type of transistor, i.e., N-channel transistors and P-channel transistors, which may require an additional band gap offset for the P-channel transistor. For this reason, it has also been proposed to appropriately adjust the threshold voltage of transistor devices by providing a specifically designed semiconductor material at the interface between the high-k dielectric material and the channel region of the transistor device, in order to appropriately "adapt" the band gap of the specifically designed semiconductor material to the work function of the metal-containing gate electrode material, thereby obtaining the desired low threshold voltage of the transistor under consideration. Typically, a corresponding specifically designed semiconductor material, such as silicon/germanium and the like, may be provided by an epitaxial growth technique at an early manufacturing stage, which may also present an additional complex process step, which, however, may avoid complex processes in an advanced stage for adjusting the work function and, thus, the threshold voltages in a very advanced process stage.

It turns out, however, that the manufacturing sequence of forming the threshold adjusting semiconductor alloy may have a significant influence on threshold variability and other transistor characteristics, as will be described in more detail with reference to FIGS. 1a-1e.

FIG. 1a schematically illustrates a cross-sectional view of a semiconductor device 100 comprising a substrate 101 above which is formed a silicon-based semiconductor material 102 having an appropriate thickness for forming therein and thereabove transistor elements. Moreover, an isolation structure 102C is formed in the semiconductor layer 102, thereby laterally delineating and thus forming active regions 102A, 102B. In this context, an active region is to be understood as a semiconductor material in which an appropriate dopant profile is to be created in order to form PN junctions for one or more transistor elements. In the example shown, the active region 102A corresponds to a P-channel transistor while the active region 102B represents an N-channel transistor. That is, the active regions 102A, 102B may comprise, in the manufacturing stage shown, an appropriate basic dopant concentration in order to determine the conductivity of a P-channel transistor and an N-channel transistor, respectively. Additionally, a mask layer 103 is formed on the active regions 102A, 102B in the form of a silicon dioxide material, which may be grown on the active regions 102A, 102B. Furthermore, an etch mask 104 is provided such that the active region 102B is covered, while the active region 102A, i.e., the mask layer 103 formed thereon, is exposed to an etch ambient 105.

The semiconductor device 100 as illustrated in FIG. 1a may be formed on the basis of the following conventional process strategies. First, the isolation structure 102C is formed on the basis of well-established lithography, etch, deposition, planarization and anneal techniques in which, for instance, a trench is formed in the semiconductor layer 102 on the basis of a lithography process, which is subsequently to be filled with an appropriate insulating material, such as silicon dioxide, silicon nitride and the like. After removing any excess material and planarizing the surface topography, the further processing is typically continued by performing a plurality of implantation sequences using an appropriate masking regime in order to introduce the required dopant species for generating the basic doping concentration in the active regions 102A, 102B corresponding to the type of transistors to be formed therein and thereabove. After activating the dopant species and re-crystallizing implantation-induced damage, the further processing is continued by forming the mask layer 103 on the basis of an oxidation process, followed by the deposition of a mask material such as a resist material, that is subsequently patterned into the mask 104 by well-established lithography techniques. Next, the etch process 105 is performed, for instance using a wet chemical etch recipe based on, for instance, hydrofluoric acid (HF), which may remove silicon dioxide material selectively with respect to silicon material. During the etch process 105, therefore, material loss in the isolation structures 102C may also occur to a more or less pronounced degree, depending on the process parameters of the etch process 105.

FIG. 1b schematically illustrates the semiconductor device 100 after the above-described process sequence and after removal of the etch mask 104 (FIG. 1a). As described before, an increased surface topography may be created during the preceding etch process since, typically, a portion of the sidewalls 102S of the active region 102A may be exposed, depending on the required over etch time for reliably removing the mask layer 103 (FIG. 1a) from the active region 102A.

FIG. 1c schematically illustrates the semiconductor device when exposed to a further process ambient 106, which may typically be established in a deposition reactor for performing a selective epitaxial growth process. For example, elevated temperatures may be applied and appropriate reactive gas components may be used in order to remove any contaminants and oxide residues from the exposed surface areas of the active region 102A, for instance in the form of a native oxide and the like. Thus, during the process 106, additional material of the isolation structures 102C, as indicated by 102R, may be removed, and also the thickness of the mask layer 103 still covering the active region 102B may be reduced. Consequently, the process 106 may further contribute to an increased exposure of the sidewall surface 102S.

FIG. 1d schematically illustrates the semiconductor device 100 during a selective epitaxial growth process 108, in which process parameters are selected in accordance with well-established recipes such that a significant material deposition is restricted to the exposed active region 102A, while a material deposition on dielectric surface areas, such as the isolation structure 102C and the mask layer 103, is strongly suppressed. During the selective epitaxial growth process 108, a silicon/germanium alloy 109 may therefore be selectively formed on the active region 102A wherein, due to the exposed sidewall surface areas 102S, a pronounced material deposition may also occur above the isolation structure 102C. Generally, the material composition of the alloy 109 as well as a thickness thereof have a strong influence on the finally obtained threshold voltage of the P-channel transistor to be formed in and above the active region 102A. For example, in sophisticated applications, a target thickness of the silicon/germanium alloy 109 may be in the range of approximately 10-50 nm, wherein a thickness variation of several percent may result in a significant variability of the finally achieved transistor characteristics. Thus, due to the exposed sidewall surface areas 102S, a different deposition behavior may occur during the process 108 at the periphery of the active region 102A compared to a central region, which may contribute to a significant thickness non-uniformity.

FIG. 1e schematically illustrates the semiconductor device 100 when exposed to an etch ambient 110 in which the mask 103 (FIG. 1d) is removed selectively with respect to the active regions 102A, 102B. For this purpose, hydrofluoric acid may be used for any other appropriate selective etch chemistry so as to not unduly remove material of the active regions 102A, 102B. On the other hand, during the etch process 110, the resulting surface topography may further be increased by additionally removing material of the isolation structures 102C, thereby contributing to a further pronounced topography at a peripheral area 102P around the active region 102A. Additionally, upon removing the mask layer 103 (FIG. 1d), the final difference in the height level between the active region 102A, which comprises the silicon/germanium alloy 109, and the active region 102B may further be increased, which may also result in an increased degree of complexity during the further processing. That is, after the etch process 110, appropriate gate dielectric materials, which typically comprise a high-k dielectric material, are formed on the basis of oxidation in combination with deposition techniques, followed by the deposition of a complex gate electrode stack, which may typically comprise a metal-containing cap layer for the high-k dielectric material and one or more additional materials. Hence, the different height levels may also result in a certain degree of non-uniformity of the resulting gate stack. Consequently, during the complex patterning sequence for forming gate electrode structures in accordance with a desired critical gate length dimension, the difference in the height levels between the active regions 102A and 102B may result in a different gate length. Furthermore, the previously deposited silicon/germanium alloy 109 may have an intrinsic thickness variability due to the material growth at the exposed sidewall surface areas 102S, which may result in a corresponding variation along the transistor width direction, i.e., the direction perpendicular to the drawing plane of FIG. 1e. Due to the strong dependence of the resulting threshold voltage on the material characteristics of the silicon/germanium alloy 109, also a pronounced variability of the threshold along the transistor width direction may be observed, thereby resulting in a high degree of transistor variability and thus in a less reliable and less predictable transistor operation.

As a consequence, although the threshold voltage of P-channel transistors including sophisticated high-k metal gate stacks may be efficiently adjusted by providing the silicon/germanium alloy 109, nevertheless, a significant variability of the threshold voltages across a single transistor and also across a plurality of closely spaced transistors may be observed. Consequently, for sophisticated applications requiring highly scaled transistor elements having a gate length of 50 nm and less, the conventional strategy for adjusting the threshold voltage of P-channel transistors comprising a sophisticated high-k metal gate electrode structure may result in a pronounced yield loss due to threshold variabilities and non-uniformity of critical dimensions, such as the gate length of P-channel transistors and N-channel transistors.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and manufacturing techniques in which patterning uniformity of sophisticated high-k metal gate stacks and the threshold variability of transistors including a threshold adjusting semiconductor alloy may be significantly reduced by enhancing surface topography prior to forming the gate stack. To this end, at least the active region receiving the threshold adjusting semiconductor alloy may be recessed prior to depositing the semiconductor alloy, thereby substantially completely avoiding the exposure of sidewall surface areas of the active region, which may thus result in superior deposition conditions during the subsequent selective epitaxial growth process. In some illustrative aspects disclosed herein, the material removal for forming the recess may be formed in the same process chamber, i.e., in the deposition reactor, thereby contributing to a highly efficient overall manufacturing flow. In other illustrative embodiments disclosed herein, a recess may also be formed in the active region of transistors that do not require the threshold adjusting semiconductor alloy, thereby even further enhancing the uniformity of the deposition process, since the "pattern loading" during the deposition process may be reduced, i.e., the pattern density dependent deposition rate during the selective epitaxial growth process.

In this respect, the term "pattern loading" may be understood as the effect of variability of layer thickness and/or material composition during a deposition process depending on the "neighborhood" of the area on which the corresponding material is to be deposited. Thus, due to the formation of a recess, the semiconductor alloy may be deposited with enhanced thickness uniformity, which may directly translate into a reduced variability of transistor characteristics.

In one illustrative embodiment, a semiconductor device is disclosed that includes, among other things, an active region in a semiconductor layer of a semiconductor device substrate, the active region having a region length and a region width that are laterally delineated by an isolation structure. Furthermore, the semiconductor device also includes a threshold adjusting semiconductor alloy material layer that is positioned on the active region substantially without overlapping the isolation structure, the threshold adjusting semiconductor alloy material layer having a layer length that is less than the region length. Additionally, the disclosed semiconductor device includes a gate electrode structure that is positioned above the threshold adjusting semiconductor alloy material layer, the gate electrode structure including a high-k dielectric material and a metal-containing electrode material formed above the high-k dielectric material.

In another exemplary embodiment of the present subject matter, a semiconductor device is disclosed that includes an isolation structure positioned in a semiconductor material layer of a semiconductor substrate, and a first active region that is laterally delineated by a first portion of the isolation structure, the first active region including the semiconductor material layer. Furthermore, the semiconductor device includes, among other things, a second active region that is laterally delineated by a second portion of the isolation structure, the second active region including the semiconductor material layer and a threshold adjusting semiconductor alloy material layer positioned on the semiconductor material layer substantially without overlapping the second portion of the isolation structure. Additionally, the disclosed semiconductor device also includes a first gate electrode structure of a first transistor element, the first gate electrode structure being positioned on the semiconductor material layer of the first active region, and a second gate electrode structure of a second transistor element, the second gate electrode structure being positioned on the threshold adjusting semiconductor alloy material layer of the second active region, wherein the first and second gate electrode structures include, among other things, a high-k dielectric material and a metal-containing electrode material formed above the high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
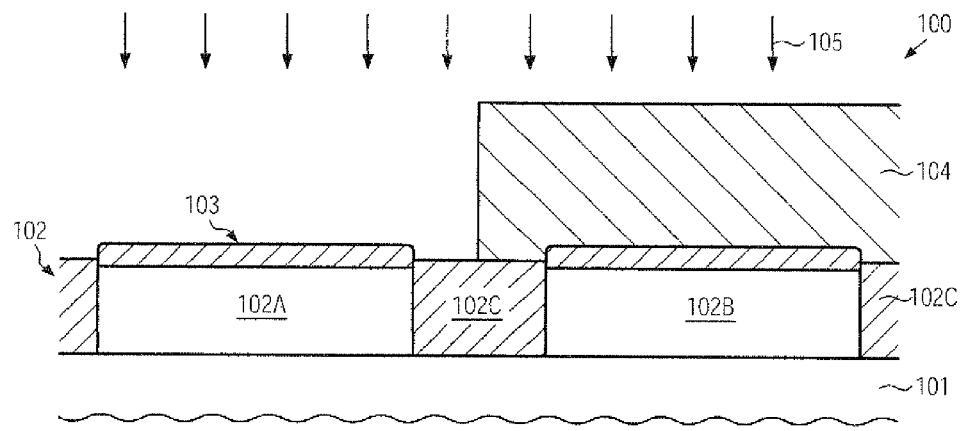
FIGS. 1a-1e schematically illustrate cross-sectional views of a conventional semiconductor device during various manufacturing stages in forming a silicon/germanium alloy selectively on the active region of a P-channel transistor for adjusting the threshold in combination with a sophisticated high-k metal gate material on the basis of conventional process techniques.
Figure 1B:
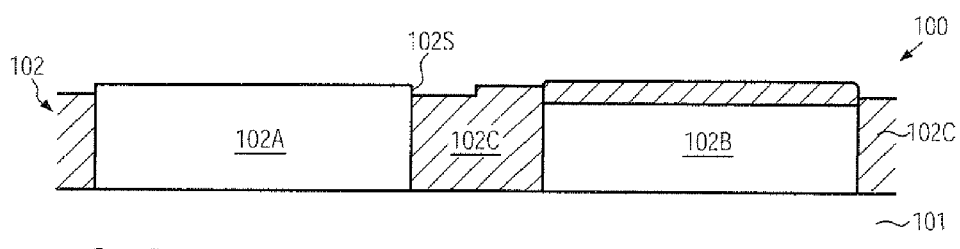
Figure 1C:
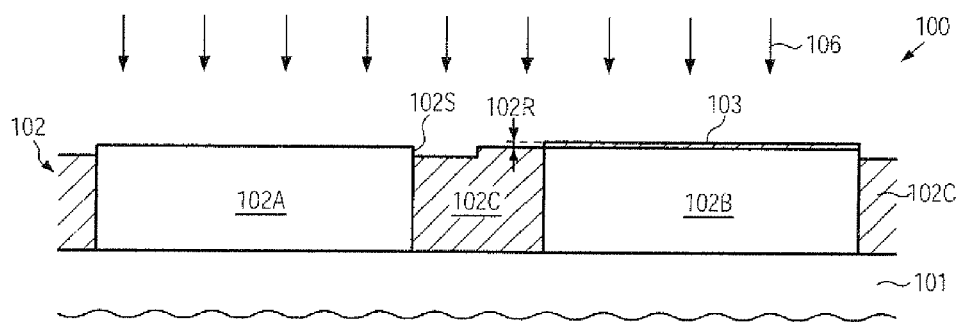
Figure 1D:
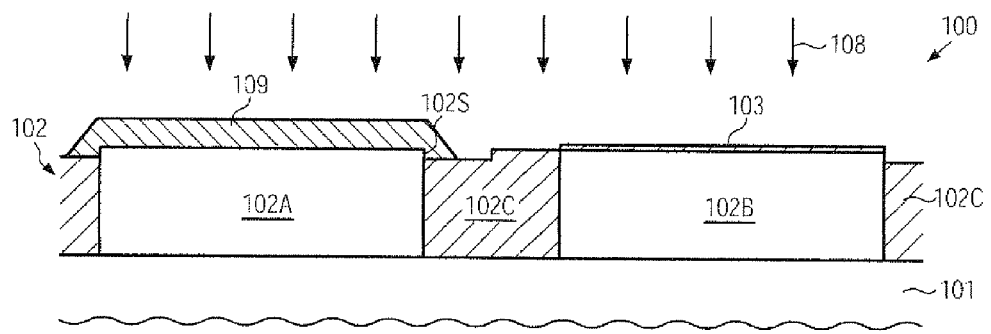
Figure 1E:
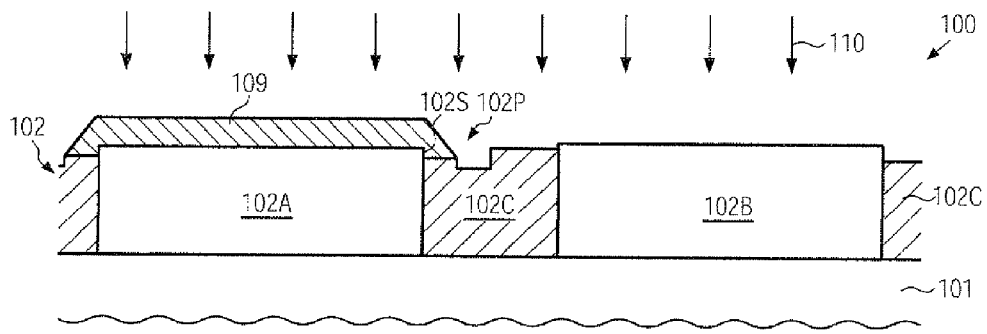

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and techniques in which sophisticated gate electrode structures may be formed in an early manufacturing stage on the basis of a high-k dielectric material and a metal-containing electrode material. In this case, the threshold voltage of one type of transistor may be adjusted, in combination with an appropriate metal species, by providing an appropriate semiconductor material in the channel region in order to obtain the desired band gap offset resulting in the required work function. The threshold adjusting semiconductor alloy, such as a silicon/germanium alloy, may be formed on the basis of an enhanced surface topography, which may result in superior deposition conditions, which in turn may directly translate into reduced thickness non-uniformity of the semiconductor alloy. For this purpose, at least the active region of one type of transistor may be recessed with respect to the isolation structure delineating the active region in order to avoid exposure of sidewall areas of the active region to the selective epitaxial growth ambient, which may conventionally result in a significant variability of material composition and/or thickness of the threshold adjusting semiconductor alloy. In one illustrative embodiment, the recessing and the subsequent selective deposition of the semiconductor alloy may be accomplished in the form of an in situ process, i.e., a process formed in the same process chamber or reactor, thereby contributing to a highly efficient process sequence substantially without affecting overall cycle time compared to conventional strategies. For example, an appropriate etch ambient may be established on the basis of at least a portion of process gas components, which may also be used for establishing the deposition ambient, thereby avoiding the introduction of any additional process resources compared to conventional process recipes.

In some illustrative embodiments, the active region of a transistor that may not require the semiconductor alloy may be covered on the basis of a hard mask, which may be removed without a significant material consumption of the isolation structures, thereby also contributing to a superior surface topography for the deposition of the sophisticated gate stack and the patterning thereof. Furthermore, by forming the corresponding hard mask by deposition, a similar height level for the active regions after the deposition of the threshold adjusting semiconductor alloy may be accomplished, which may result in superior lithography conditions for adjusting similar critical gate length dimensions of gate electrodes of different transistor types.

In still other illustrative embodiments, the recessing and the subsequent deposition of the threshold adjusting semiconductor alloy may be performed for P-channel transistors and N-channel transistors, thereby enhancing overall process uniformity, wherein the semiconductor alloy may be subsequently selectively removed from above the active region of one of the transistors. Consequently, in combination with the superior process conditions due to the non-exposure of sidewalls areas of the active regions, the increased uniformity in deposition rate may even further enhance the overall uniformity of the resulting threshold adjusting material, thereby further reducing transistor variability, for instance in view of threshold variations.

With reference to FIGS. 2a-2i, further illustrative embodiments will now be described in more detail, wherein reference may also be made to FIGS. 1a-1e, if required.

Figure 2A:
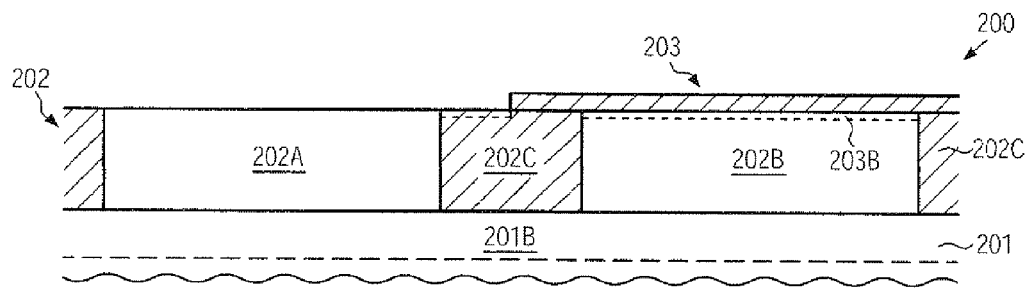
FIGS. 2a-2d schematically illustrate cross-sectional views of a semiconductor device during various manufacturing stages in forming a threshold adjusting semiconductor alloy selectively on a recessed active region, according to illustrative embodiments.

FIG. 2a schematically illustrates a semiconductor device 200 comprising a substrate 201 above which may be formed a semiconductor layer 202, which may represent any appropriate semiconductor material, such as a silicon material and the like. Furthermore, in some illustrative embodiments, at least in some device areas of the semiconductor device 200, a buried insulating layer 201B may be formed between the substrate 201 and the semiconductor layer 202, thereby providing a silicon-on-insulator (SOI) configuration, while, in other cases, the buried insulating layer 201B may not be present, as is for instance described with reference to the device 100 when referring to FIGS. 1a-1e. The semiconductor layer 202 may comprise an isolation structure 202C, such as a shallow trench isolation, which may laterally delineate or enclose and thus form active regions 202A, 202B. With respect to the definition of an active region, the same criteria may apply as previously explained with reference to the device 100. Furthermore, in the manufacturing stage shown, a mask layer 203 may be formed such that the active region 202B, possibly in combination with a part of the isolation structure 202C, may be covered, while the active region 202A is exposed, except for any contaminants or minute material residues, such as a native oxide and the like. In some illustrative embodiments, the mask layer 203 may be comprised of an oxide material, as is for instance described with reference to FIG. 1a, while in other cases the mask layer 203 may be comprised of any appropriate dielectric material, such as silicon dioxide as a deposited material, silicon nitride and the like. For example, using silicon nitride as the mask material 203 may enable the patterning of the layer 203 and the removal thereof in a later manufacturing stage with a significantly reduced degree of material loss of the isolation structures 202C.

The semiconductor device 200 as illustrated in FIG. 2a may be formed on the basis of well-established process techniques, described above with reference to the semiconductor device 100, when the mask layer 203 may be formed by oxidation, as indicated by 203B. In this case, a similar material loss in the isolation structures 202C and the active region 202A may occur, as previously described. In other cases, the mask layer 203 may be formed by deposition, thereby reducing the amount of material loss in the isolation structures 202C and the active region 202A, even when comprised of a similar material as the isolation structures 202C. In some illustrative embodiments, the mask layer 203 may be deposited in the form of a dielectric material, such a silicon nitride, which may have a different etch behavior compared to the isolation structure 202C. In this case, the mask layer 203 may be patterned on the basis of, for instance, a resist mask using selective plasma assisted or wet chemical etch recipes, such as hot phosphoric acid and the like. In this case, a superior surface topography, i.e., a less pronounced material loss, may be accomplished and may further enhance the further process of the device 200.

Figure 2B:
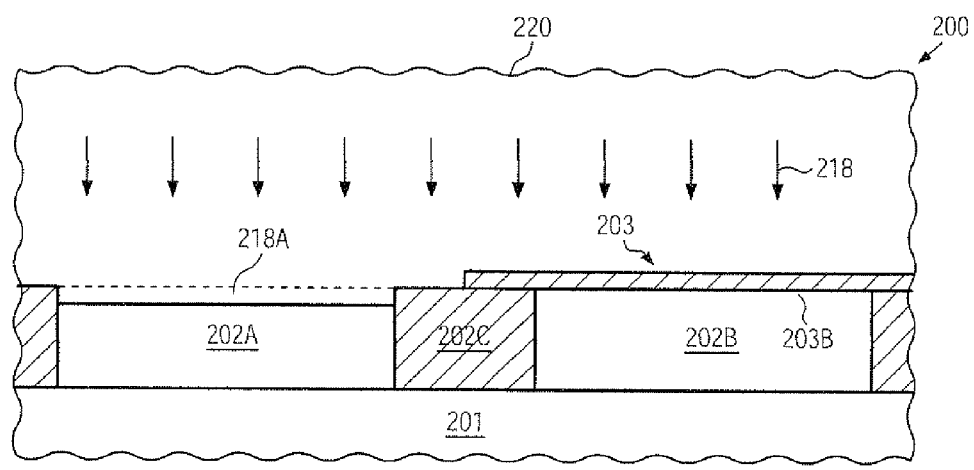

FIG. 2b schematically illustrates the semiconductor device 200 in a further advanced manufacturing stage. As illustrated, the semiconductor device 200 may be positioned in an appropriate manufacturing environment, such as a process chamber or reactor 220, in which appropriate temperature, pressure, gas components and the like may be applied or introduced in order to establish an etch ambient 218. For example, the process chamber or reactor 220 may be provided in the form of any well-established deposition tool, which may typically be used for performing selective epitaxial deposition processes. Prior to establishing the etch ambient 218, any appropriate reactive ambient may be established so as to remove additional surface contaminants, such as oxide residues and the like, as is also previously explained with reference to the semiconductor device 100. It should be appreciated that, in this case, a certain degree of material loss of the isolation structures 202C may occur, and also the mask layer 203 may be reduced in thickness, depending on the material composition thereof. In other cases, the mask layer 203 may be provided in the form of, for instance, a silicon nitride material, which may exhibit increased etch resistivity with respect to the corresponding surface cleaning process. Thereafter, the etch ambient 218 may be established which, in one illustrative embodiment, may be accomplished on the basis of process gas components which may also be used in the subsequent selective deposition of a threshold adjusting semiconductor alloy. It is well known that semiconductor materials such as silicon/germanium, silicon/carbon and the like may be deposited on the basis of appropriate precursor gases, which may represent reducible gas components which, in combination with a reducing agent such as hydrogen and the like, may result in a release of the semiconductor species that may deposit on exposed surface areas, wherein additionally other process parameters such as temperature, pressure and the like may be adjusted such that the deposition may occur substantially on exposed semiconductor surface areas only. Thus, the etch ambient 218 may be established on the basis of similar process gas components, for instance by omitting the reducing gas component, which may result in a highly selective etch process for removing material of the exposed active region 202A. Thus, a recess 218A may be formed during the etch process 218. Appropriate process parameters such as etch time and the like may readily be determined on the basis of experiments and the like.

Figure 2C:
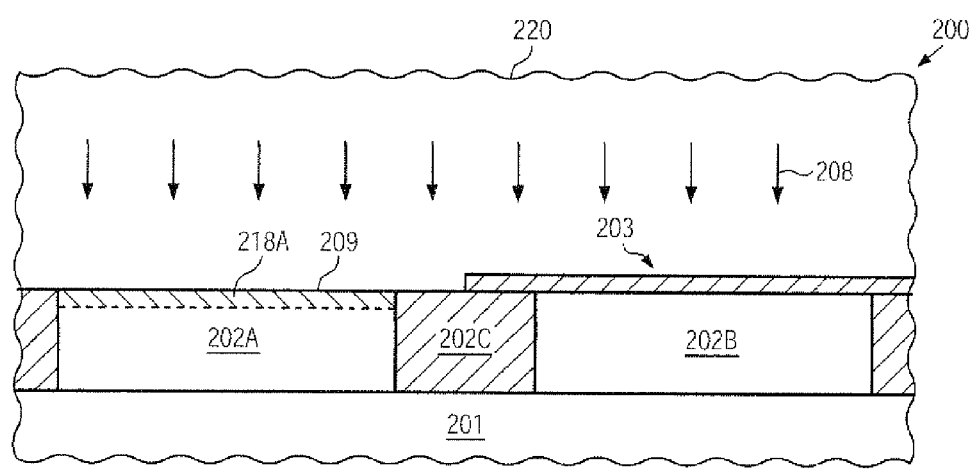

FIG. 2c schematically illustrates the semiconductor device 200 in a further advanced manufacturing stage in which a deposition ambient 208 may be established within the process environment 220, i.e., in the process chamber or reactor. Thus, the processes 218 and 208 may be considered as an in situ process since the substrate 201 may remain in the same process chamber without requiring any transport activities or exposure to the ambient atmosphere when establishing the deposition ambient 208 after the etch process 218 (FIG. 2b). As explained above, the deposition ambient 208 may be established on the basis of any appropriate selective epitaxial growth recipe, wherein similar process gas components may be used as may have been applied during the preceding process for providing the recess 218A, as explained above. Consequently, during the deposition process 208, a semiconductor alloy 209 may be selectively formed in the recess 218A, wherein enhanced uniformity of the deposition rate may be achieved across the entire active region 202A since any exposed sidewall surface area may not be present, as is the case in the conventional strategy. Consequently, the semiconductor alloy 209, such as a silicon/germanium alloy, may be provided with superior thickness uniformity, while also the uniformity with respect to material composition may be enhanced. For example, the material 209 may be provided with a thickness of approximately 50 nm and less with a variability of approximately 5 percent or significantly less, such as 2 percent, relative to a maximum thickness of the layer 209 across the entire active region 202A. Furthermore, the material 209 may be provided in the form of a silicon/germanium alloy having a germanium concentration of approximately 25 atomic percent germanium or less. Moreover, due to the recess 218A, the material 209 may be substantially confined by the isolation structure 202C and thus a corresponding overlap of the material 209 with the isolation structure 202C may be avoided.

Figure 2D:
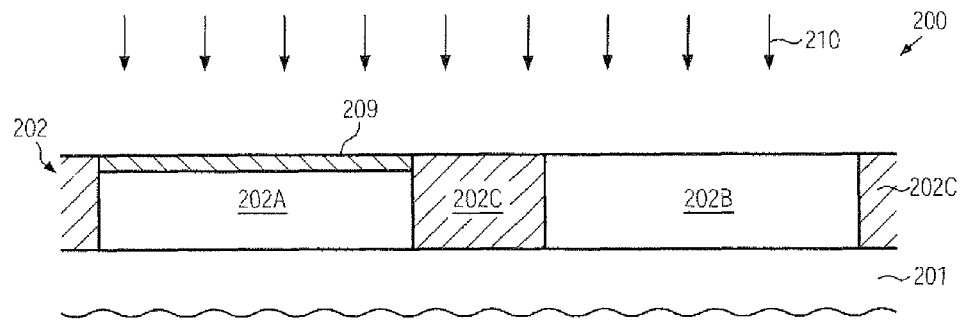

FIG. 2d schematically illustrates the semiconductor device 200 when exposed to a further etch ambient 210, such as a wet chemical etch recipe for removing the mask layer 203 (FIG. 2c) selectively to the semiconductor alloy 209 and the active region 202B. For instance, hydrofluoric acid may be used if the mask layer 203 may be comprised of silicon dioxide, while other chemistries may be applied, such as hot phosphoric acid, when a silicon nitride material is to be removed selectively with respect to the other components. In this case, the material loss of the isolation structures 202C may be maintained at a low level. In this case, a superior overall surface topography may be accomplished since in total the material loss of the isolation structures 202C may be reduced, compared to conventional strategies, while also a difference in height level of the active regions 202A, comprising the alloy 209, and the active region 202B may be reduced compared to the conventional approaches. Consequently, during the subsequent manufacturing process, for instance for forming sophisticated gate electrode structures, enhanced uniformity of the process results may be accomplished.

Figure 2E:
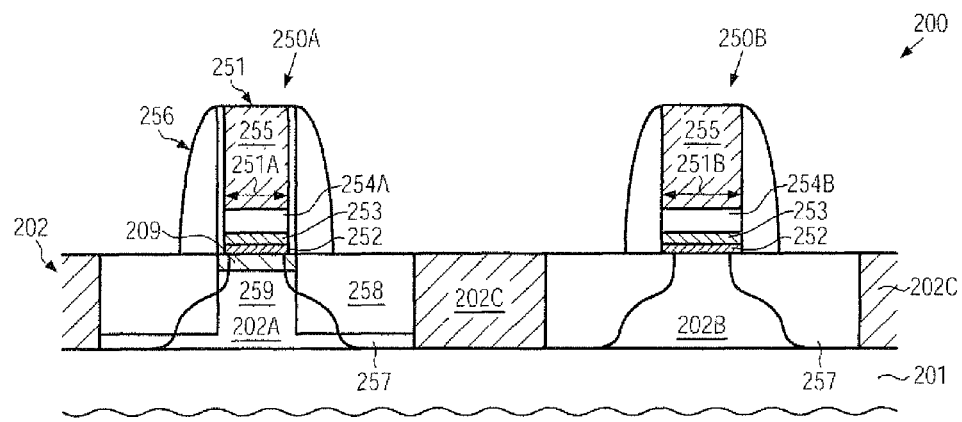
FIG. 2e schematically illustrates a cross-sectional view of the semiconductor device illustrating field effect transistors comprising sophisticated high-k metal gate electrodes in a section along the transistor length direction.

FIG. 2e schematically illustrates the semiconductor device 200 in a further advanced manufacturing stage. As illustrated, a transistor 250A may be formed in and above the active region 202A, which may comprise at least partially the semiconductor alloy 209, while a transistor 250B may be formed in and above the active region 202B. The transistors 250A, 250B may represent a P-channel transistor and an N-channel transistor, in illustrative embodiments, each having a sophisticated gate electrode structure 251 based on a high-k dielectric material 253 and a metal-containing electrode material 254A, 254B, respectively. Furthermore, an additional metal or other electrode material 255 may be provided. For example, the high-k dielectric material 253 may be comprised of any of the above-indicated materials, possibly in combination with a "conventional" dielectric material 252, for instance in the form of silicon dioxide, silicon nitride and the like. Furthermore, the metal-containing electrode material 254A, which may be formed directly on the high-k dielectric material 253 may result, in combination with the threshold adjusting material 209, in an appropriate work function so as to obtain the desired threshold of the transistor 250A, which may exhibit a significantly reduced variability along the transistor width direction, i.e., the direction perpendicular to the drawing plane of FIG. 2e. On the other hand, the transistor 250B may comprise the electrode material 254B which may result in a desired work function of the transistor 250B. It should be appreciated that, typically, the layers 254A, 254B may be comprised of specific metal species, at least corresponding metal species may be diffused into the high-k dielectric material 253 in order to provide the required transistor threshold voltages.

Moreover, a spacer structure 256 may be formed on sidewalls of the gate electrode structures 251 in order to act as an implantation mask for forming drain and source regions 257 having a desired lateral and vertical dopant profile. Furthermore, one or both of the transistors 250A, 250B may comprise additional performance enhancing mechanisms, such as a strain-inducing semiconductor alloy 258 formed in the active region, such as the active region 202A, for instance in the form of a silicon/germanium alloy and the like. In this case, the material 258 may induce a desired type of strain in a channel region 259, thereby increasing charge carrier mobility, as explained above.

The semiconductor device 200 as illustrated in FIG. 2e may be formed on the basis of any appropriate manufacturing technique, such as the formation of a material stack for the gate electrode structure 251, which may then be patterned on the basis of sophisticated patterning techniques. Due to the superior uniformity of the material 209 and due to the reduced difference in height levels between the active regions 202A, 202B, superior patterning uniformity may be accomplished, thereby resulting in a gate length 251A, 251B, which may exhibit less variability with respect to a desired target value. It should be appreciated that, if required, the material 258 may be formed after the patterning of the gate electrode structure, for instance by forming appropriate cavities in the active region 202A and filling the same with the desired semiconductor alloy. Thereafter, the drain and source regions 257 may be formed in combination with the spacer structure 256, followed by any anneal processes for activating the dopant species and re-crystallizing implantation-induced damage. The further processing may then be continued by forming metal silicide regions, if required, in the drain and source regions 257 and possibly in the material 255 when comprising a significant amount of silicon material. Thereafter, a dielectric material may be deposited, for instance in a stressed state if desired, and contact elements may be formed therein so as to connect to the transistors 250A, 250B.

Figure 2F:
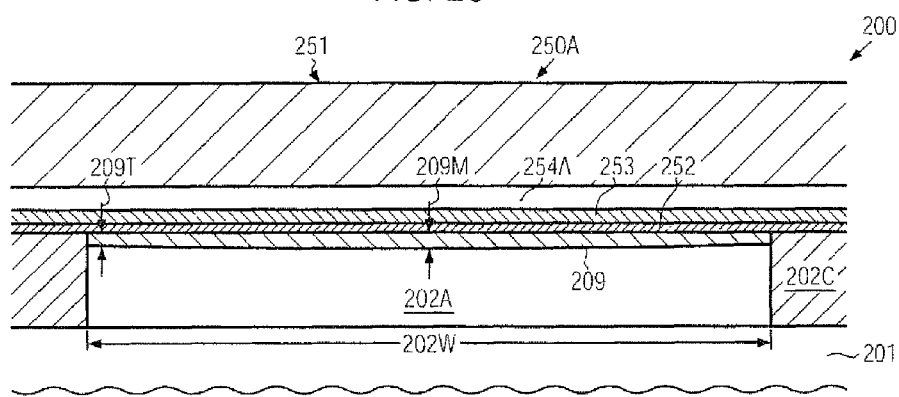
FIG. 2f schematically illustrates a section along the transistor width direction with a gate electrode structure formed on a threshold adjusting semiconductor alloy having a superior uniformity, according to illustrative embodiments.

FIG. 2f schematically illustrates a cross-sectional view of the transistor 250A along the transistor width direction. As illustrated, the threshold adjusting semiconductor material 209 may extend along the entire width 202W of the active region 202A. Thus, the material 209 may substantially not overlap with the isolation structure 202C, even if a certain degree of material loss occurs in these isolation structures during the patterning of the transistor 250A. Moreover, as illustrated, the gate electrode structure 251 may stand above the isolation structure 202C, depending on the overall circuit layout of the device 200. Furthermore, a thickness 209T may exhibit a significantly reduced variability along the width 202W and may be less than approximately 5 percent with respect to a maximum thickness 209M, while in some illustrative embodiments even a thickness variation of less than approximately 2 percent or even less may be achieved. Consequently, a corresponding threshold variability along the width 202W may also be reduced compared to conventional semiconductor devices.

Figure 2G:
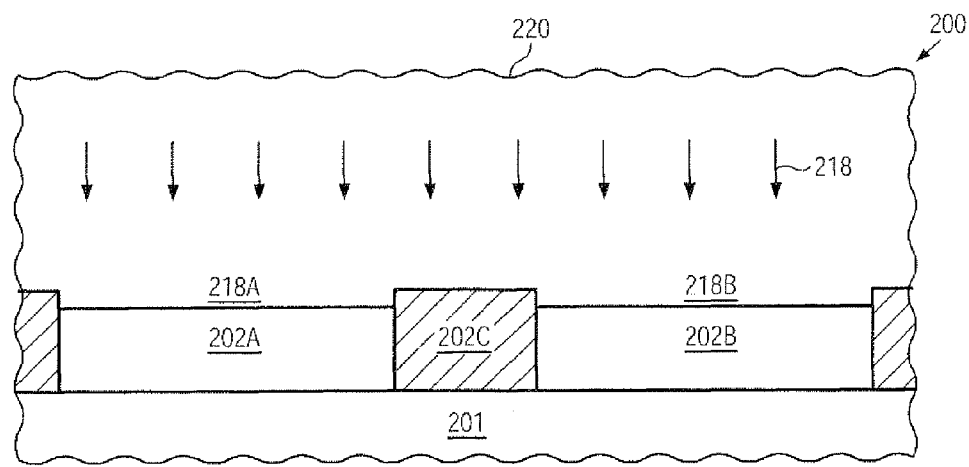
FIGS. 2g-2i schematically illustrate cross-sectional views of the semiconductor device according to further illustrative embodiments in which process uniformity during the selective epitaxial growth process may further be enhanced by recessing both active regions and forming therein the semiconductor alloy.
Figure 2H:
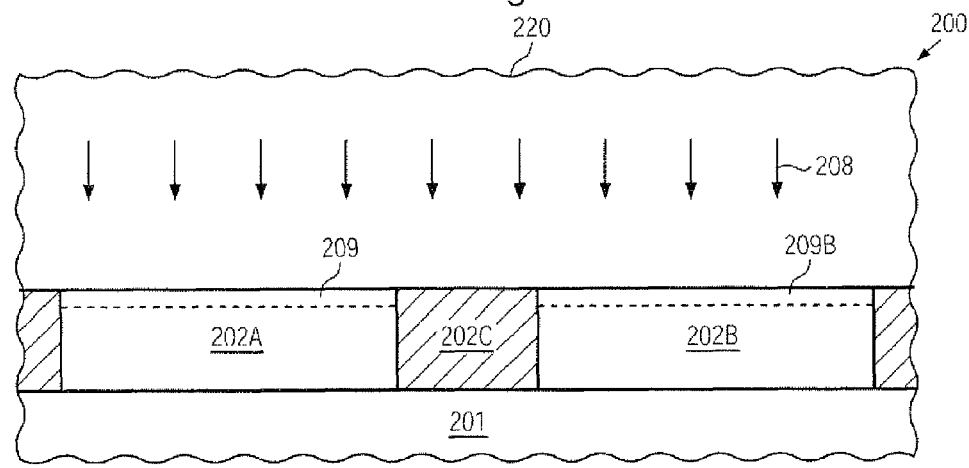
Figure 2I:
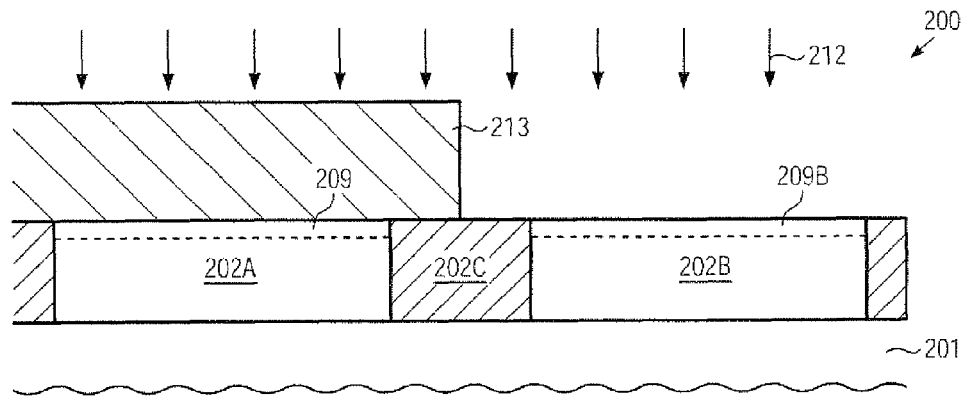

With reference to FIGS. 2g-2i, further illustrative embodiments will now be described in which a further enhanced process uniformity may be accomplished by reducing deposition rate variability, which may also be referred to as pattern loading.

FIG. 2g schematically illustrates the semiconductor device 200 in a manufacturing stage in which the device 200 may be exposed to the etch ambient 218 within the process environment 220. As illustrated, the active region 202B may not be covered by a mask material so that a corresponding surface topography may be less pronounced since processes for forming a mask material and patterning the same may be omitted. Thus, during the etch process 218, material of the active regions 202A, 202B may be removed selectively to the isolation structure 202C, thereby forming the recess 218A and a recess 218B. With respect to any process parameters, the same criteria may apply as previously explained.

FIG. 2h schematically illustrates the semiconductor device 200 during the deposition process 208, thereby forming the semiconductor material 209 on the active region 202A and a semiconductor alloy 209B on the active region 202B, wherein the materials 209, 209B may have the same composition. During the deposition process 208, enhanced process uniformity may be accomplished since a similar deposition rate may be accomplished for P-channel transistors, since typically one or more N-channel transistors may be positioned in the vicinity of the P-channel transistor under consideration, even device regions of different packing density are considered. Thus, the material 209 and also the material 209B may be provided with superior uniformity.

FIG. 2i schematically illustrates the semiconductor device 200 in a further advanced manufacturing stage. As illustrated, the device 200 may be exposed to an etch ambient 212 on the basis of an etch mask 213 that may cover the active region 202A and thus the semiconductor alloy 209. On the other hand, the material 209B may be exposed to the ambient 212. For example, highly selective etch recipes, for instance on the basis of tetra methyl ammonium hydroxide (TMAH) and the like, are available and may be used during the etch process 212 in order to remove the material 209B with a high degree of controllability. Consequently, the active region 202B may be provided with a well-defined recess, while the material 209 may be preserved in the process 212 and may have the superior uniformity due to the preceding common deposition of the materials 209, 209B. Thereafter, the further processing may be continued by removing the mask 213 and forming the gate electrode structures, as previously described. It should be appreciated that, due to well-defined condition of the active region 202B, a corresponding mismatch in height level between the active regions 202A, 202B may be taken into consideration when designing a corresponding lithography mask since any slight difference in the exposure condition may thus be compensated for since the corresponding difference in height levels occurs with a high degree of uniformity and thus predictability.

As a result, the present disclosure provides semiconductor devices and techniques in which a threshold adjusting semiconductor alloy, such as a silicon/germanium alloy, may be provided with superior uniformity by recessing at least the active region of one transistor type. Consequently, the thickness and material composition of the threshold adjusting semiconductor alloy may be enhanced compared to conventional strategies since exposed sidewall surface areas of the active region may be avoided. For this reason, threshold variability, for instance along the transistor width direction, may be significantly reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
   an active region in a semiconductor layer of a semiconductor device substrate, said active region having a region length and a region width that are laterally delineated by an isolation structure;
   a threshold adjusting semiconductor alloy material layer having a layer length and a layer width that is positioned on said active region substantially without overlapping said isolation structure, wherein said layer length that is less said region length; and
   a gate electrode structure that is positioned above said threshold adjusting semiconductor alloy material layer, said gate electrode structure comprising a high-k dielectric material and a metal-containing electrode material formed above said high-k dielectric material, wherein said region length and said layer length extend substantially along a gate length direction of said gate electrode structure, and said region width and said layer width extend substantially along a gate width direction of said gate electrode structure.

2. The semiconductor device of claim 1, wherein a thickness of said threshold adjusting semiconductor alloy material layer varies along said layer width by less than approximately 5 percent relative to a maximum thickness of said threshold adjusting semiconductor alloy material layer.

3. The semiconductor device of claim 1, wherein said maximum thickness is approximately 15 nm or less.

4. The semiconductor device of claim 3, wherein said gate electrode structure is a part of a P-channel transistor.

5. The semiconductor device of claim 4, wherein said threshold adjusting semiconductor alloy material layer comprises a silicon/germanium alloy with a germanium concentration of approximately 20 to 25 atomic percent.

6. The semiconductor device of claim 4, further comprising first and second strain-inducing semiconductor material regions positioned in source and drain regions, respectively, of said P-channel transistor, wherein said positions of said first and second strained semiconductor material regions laterally define said layer length of said threshold adjusting semiconductor alloy material layer.

7. The semiconductor device of claim 1, further comprising a second active region comprising a silicon channel region and a second gate electrode structure formed above said silicon channel region.

8. The semiconductor device of claim 1, wherein said layer width is substantially the same as said region width.

9. A semiconductor device, comprising:
   an isolation structure positioned in a semiconductor material layer of a semiconductor substrate;
   a first active region that is laterally delineated by a first portion of said isolation structure, said first active region comprising said semiconductor material layer;
   a second active region that is laterally delineated by a second portion of said isolation structure, said second active region comprising said semiconductor material layer and a threshold adjusting semiconductor alloy material layer positioned on said semiconductor material layer substantially without overlapping said second portion of said isolation structure;

a first gate electrode structure of a first transistor element, said first gate electrode structure being positioned above said semiconductor material layer of said first active region; and a second gate electrode structure of a second transistor element, said second gate electrode structure being positioned above said threshold adjusting semiconductor alloy material layer of said second active region, wherein said first and second gate electrode structures comprise a high-k dielectric material and a metal-containing electrode material formed above said high-k dielectric material, and wherein a lateral length of said threshold adjusting semiconductor alloy material layer extending along a gate length direction of said second gate electrode structure is less than a lateral length of said second active region extending along said gate length direction.

10. The semiconductor device of claim 9, wherein an upper surface of said semiconductor material layer of said first active region is at substantially a same height level as an upper surface of said threshold adjusting semiconductor alloy material layer of said second active region.

11. The semiconductor device of claim 9, wherein an upper surface of said semiconductor material layer of said first active region is recessed relative to an upper surface of said threshold adjusting semiconductor alloy material layer of said second active region.

12. The semiconductor device of claim 9, further comprising a strain-inducing semiconductor material positioned in source and drain regions of at least one of said first and second transistor elements, said strain-inducing semiconductor material inducing strain in a channel region of said at least one of said first and second transistor elements.

13. The semiconductor device of claim 9, wherein said semiconductor material layer comprises silicon and said threshold adjusting semiconductor alloy material layer comprises silicon/germanium.

14. The semiconductor device of claim 13, wherein a germanium concentration of said threshold adjusting semiconductor alloy material layer is approximately 25 atomic percent or less.

15. The semiconductor device of claim 9, wherein a thickness of said threshold adjusting semiconductor alloy material layer is less than approximately 50 nm.

16. The semiconductor device of claim 9, wherein a maximum thickness of said threshold adjusting semiconductor alloy material layer is less than approximately 5 percent greater than a minimum thickness of said threshold adjusting semiconductor alloy material layer.

17. The semiconductor device of claim 9, wherein a maximum thickness of said threshold adjusting semiconductor alloy material layer is less than approximately 2 percent greater than a minimum thickness of said threshold adjusting semiconductor alloy material layer.

18. The semiconductor device of claim 9, wherein said first transistor element is an N-channel device and said second transistor element is a P-channel device.

19. The semiconductor device of claim 9, further comprising a plurality of strain-inducing semiconductor material regions positioned in said second active region, wherein said positions of said plurality of strained semiconductor material regions laterally define said lateral length of said threshold adjusting semiconductor alloy material layer.

20. The semiconductor device of claim 19, wherein a thickness of said threshold adjusting semiconductor alloy material layer is less than approximately 50 nm.

21. The semiconductor device of claim 19, wherein a maximum thickness of said threshold adjusting semiconductor alloy material layer is less than approximately 2 percent greater than a minimum thickness of said threshold adjusting semiconductor alloy material layer.

22. A semiconductor device, comprising:
an isolation structure positioned in a semiconductor material layer of a semiconductor substrate;
a first active region that is laterally delineated by a first portion of said isolation structure, said first active region comprising said semiconductor material layer;
a second active region that is laterally delineated by a second portion of said isolation structure, said second active region comprising said semiconductor material layer and a threshold adjusting semiconductor alloy material layer positioned on said semiconductor material layer substantially without overlapping said second portion of said isolation structure, wherein a maximum thickness of said threshold adjusting semiconductor alloy material layer is less than approximately 5 percent greater than a minimum thickness of said threshold adjusting semiconductor alloy material layer;
a first gate electrode structure of a first transistor element, said first gate electrode structure being positioned above said semiconductor material layer of said first active region; and
a second gate electrode structure of a second transistor element, said second gate electrode structure being positioned above said threshold adjusting semiconductor alloy material layer of said second active region, wherein said first and second gate electrode structures comprise a high-k dielectric material and a metal-containing electrode material formed above said high-k dielectric material.

* * * * *